United States Patent [19]
McDonald et al.

[11] Patent Number: 5,254,949
[45] Date of Patent: Oct. 19, 1993

[54] NUCLEAR MAGNETIC RESONANCE IMAGING METHODS

[75] Inventors: Peter J. McDonald, Guildford; Pawel F. Tokarczuk, South Ruislip, both of England

[73] Assignee: British Technology Group Ltd., London, England

[21] Appl. No.: 781,206

[22] PCT Filed: Jun. 22, 1990

[86] PCT No.: PCT/GB90/00967
§ 371 Date: Dec. 11, 1991
§ 102(e) Date: Dec. 11, 1991

[87] PCT Pub. No.: WO91/00529
PCT Pub. Date: Jan. 10, 1991

[30] Foreign Application Priority Data

Jun. 23, 1989 [GB] United Kingdom ............... 8914467

[51] Int. Cl.⁵ .......................................... G01R 33/20
[52] U.S. Cl. ................................................ 324/309
[58] Field of Search ............. 324/300, 307, 309, 318, 324/322

[56] References Cited

U.S. PATENT DOCUMENTS

| | | | |
|---|---|---|---|
| Re. 32,712 | 7/1988 | Likes | 324/307 |
| 4,651,096 | 3/1987 | Buonocore | 324/309 |
| 4,691,162 | 9/1987 | Van Uijen | 324/309 |
| 4,701,706 | 10/1987 | Haacke | 324/309 |

FOREIGN PATENT DOCUMENTS 0026265 4/1981 European Pat. Off. .
0259998 3/1988 European Pat. Off. .

OTHER PUBLICATIONS

McDonald, P. J. et al., An NMR multiple pulse sequence for the imaging of solids using sinusoidally driven magnetic field gradients, J. Phys. E. Scientific Instruments, vol. 22, No. 3, Mar. 1989, pp. 948-951.

Journal of Magnetic Resonance, vol. 82, No. 3, May 1989, Academic Press, Inc., (Duluth, Minn., US) J. B. Miller et al.: "1H-refocused gradient imaging of solids", pp. 529-538.

Journal of Physics E: Scientific Instruments, vol. 22, No. 3, Mar. 1989, IOP Publishing Ltd. (Bristol, GB) D. G. Cory et al.: "13C NMR imaging of solids with magic angle sample spinning", pp. 180-184.

Journal of Magnetic Resonance, vol. 82, No. 2, Apr. 1989, Academic Press, Inc., (Duluth, Minn., US), D. G. Cory et al. "Magnetic field gradient imperfections in NMR imaging of rotating solids", pp. 374-381.

Journal of Magnetic Resonance, vol. 79, No. 1 Aug. 1988, Academic Press, Inc., (Duluth, Minn, US), M. Corti et al.: "Slice-selection method for topical NMR in solids", pp. 21-27.

*Primary Examiner*—Michael J. Tokar
*Attorney, Agent, or Firm*—Cushman, Darby & Cushman

[57] ABSTRACT

To derive NMR imaging information an object is subjected to a static magnetic field on which is superimposed a sinusoidally time varying magnetic gradient field. A sequence of narrow 90° rf pulses are applied around the instants when the gradient field has a zero value. The rf pulses have relative phase quadrature such that excited nuclei precess with accumulated phase in each sequence.

13 Claims, 2 Drawing Sheets

NUCLEAR MAGNETIC RESONANCE IMAGING METHODS

BACKGROUND OF THE INVENTION

This invention relates to NMR imaging methods and has particular application in methods of obtaining NMR imaging information from solid objects.

The NMR imaging of solid and other materials which have short spin-spin relaxation times has not been developed to the same level of sophistication as the NMR imaging of liquid and quasi-liquid materials. This is because of the inherently greater linewidth in solids compared to liquids which forces the use of excessively large magnetic field gradients in prohibitively short times if traditional techniques are to be adopted. One kind of method that has been proposed to overcome the difficulties associated with imaging in solids uses multipulse sequences to provide line narrowing. However, the biggest drawback with multipulse sequencing concerns the large radio-frequency pulse power which is required. In part at least this is needed to overcome the large spectral width in an imaging experiment resulting from the presence of magnetic field gradients during the time of application of rf pulses.

SUMMARY OF THE INVENTION

It is an object of the invention to provide a method in which the requirements of rf power are reduced.

According to the invention a method of obtaining NMR imaging information from a solid object comprising subjecting the object to a static magnetic field, applying a gradient magnetic field which varies sinusoidally in amplitude about a zero value, applying a repetitive sequence of radio frequency pulses at instants of zero value of the said gradient field each of such frequency, magnitude and duration and successive pulses of the sequence being of such relative rf phase, that selected nuclei in the object precess with accumulated phase in each sequence, and measuring the resulting NMR signal from the object.

Since the magnetic field gradients are at or close to zero during the time of application of rf pulses, considerable advantage is gained. Furthermore while rapid gradient switching is difficult to achieve on the timescale of multipulse experiments, it can nevertheless be achieved more easily when the coil windings generating the magnetic gradient fields are incorporated in a tuned circuit driven resonantly at a frequency with cycle time equal to twice the rf interpulse period $\tau$, thus generating a sinusoidally time varying magnetic gradient field.

In carrying out the invention the rf pulse sequence should preferably be such that the pulses of the sequence are separated by constant interpulse window lengths, equal to half the magnetic gradient field cycle time $2\tau$. In this arrangement the sign of the magnetic gradient field reverses in successive windows and the sequence therefore is such as to make the spins accumulate phase in the rotating frame from an oscillating magnetic field offset as opposed to a static field offset. The spins specifically do not accumulate phase from a static resonance offset. This prevents magnet inhomogeneities and mistuning introducing errors into the phase accumulated by the spins due to the field gradients. As an added bonus it also removes chemical shift broadening.

In some embodiments of the invention a sinusoidal offset magnetic field of spatially uniform amplitude is superimposed on the sinusoidally time-varying gradient magnetic field to shift spikes in the observed signal after Fourier transformation caused by rf phase errors away from areas of interest.

A sequence of 90° pulses and windows of length $\tau$ which fulfills the above requirements is $$90_{-y}\text{-}\tau\text{-}(90_{-x}\text{-}\tau\text{-}90_{-y}\text{-}\tau\text{-}90_{-x}\text{-}\tau\text{-}90_{-x}\text{-}\tau\text{-}90_{-y}\text{-}\tau\text{-}90_{-x}\text{-}\tau\text{-})_n \quad (1)$$

where the suffixes "-y" and "-x" refer to the rf phase of different pulses of a sequence relative to each other and n is an integer. The product of the six pulses of the repeated cycle is unity as can be easily verified using simple matrices. For the case of an oscillating magnetic field resonance offset of mean magnitude $B_g$ the mean Hamiltonian acting in odd numbered windows of the cycle is $$H_O = -\gamma^h B_g \sum_j I_z^j + \sum_{i<j} A_{ij}(I^i \cdot I^j - 3I_z^i I_z^j) \quad (2)$$

and in even numbered windows is $$H_E = +\gamma^h B_g \sum_j I_z^j + \sum_{i<j} A_{ij}(I^i \cdot I^j - 3I_z^i I_z^j) \quad (3)$$

In equations (2) and (3) the first term on the right-hand side is the Zeeman interaction due to the offset field and the second term is the van-Vleck truncated dipolar Hamiltonian. The symbols have their usual meaning. The procedure for calculation of the average Hamiltonian acting over the complete six pulse cycle and hence the observed transverse magnetisation is well established. The Hamiltonian "states" in the toggling reference frame to which the Hamiltonian in each window is transformed can be indicated as $(Y, X, \overline{Z}, \overline{X}, \overline{Y}, \overline{Z})$. Thus to first order the average Hamiltonian acting over the complete cycle is $$H = \tfrac{1}{3}\gamma B_g \sum_j I_z^j \quad (4)$$

It is seen that the dipolar Hamiltonian has been removed so achieving the aim of line narrowing, indeed it is removed over each consecutive half cycle. If the signal is observed in window six of each cycle quadrature magnetisations $$M_{x'} = M_0 \cos(\gamma B_g t/3) \quad (5)$$

and $$M_{y'} = M_0 \sin(\gamma B_g t/3) \quad (6)$$

are measured. $M_0$ is the equilibrium magnetisation. The main objective has been achieved. The spins precess in the rotating frame at a frequency proportional to $\tfrac{1}{3}$ of the mean magnitude of the oscillating offset they experience.

In the usual way the offset field is made spatially dependent by the introduction of a gradient field of mean magnitude g. Including time dependence it is, for the x direction $$B_g = \pi g x/2 \cdot \sin(\pi t/\tau) \quad (7)$$

Including the spin density p(x) the observed signal (in complex notation) is $$M(t) = M_{x'}(t) + iM_{y'}(t) = M_o \int_{x=-\infty}^{\infty} \rho(x)\exp(i\gamma gxt/3)dx \quad (8)$$

This can be Fourier transformed with respect to time to recover the spin density profile $$\rho(x) = 1/\pi M_o \cdot \gamma g/3 \cdot Re \int_{t=0}^{\infty} M(t)\exp(-i\gamma gxt/3)dt \quad (9)$$

In the case that the field offset does not oscillate but is of constant magnitude, $B_c$, then $$H_o = H_E = -\gamma^h B_c \sum_j I_z^j + \sum_{i<j} A_{ij}(I^i I^j - 3I_z^i I_z^j) \quad (10)$$

The Hamiltonian states in the toggling frame are $(Y,\overline{X},\overline{Z}, X,\overline{Y},Z)$, so that $$\overline{H} = 0 \quad (11)$$

again to first order. This is an important result. It means that the sequence is insensitive to DC magnetic field offsets. If the mean Hamiltonian were not equal to zero for constant fields, spins experiencing a combination of toggling and static fields would precess about an intermediate axis making recovery of spatial information difficult. This result also implies that chemical shift information is lost and therefore that chemical shift broadening is removed. Susceptibility broadening is also removed.

BRIEF DESCRIPTION OF THE DRAWINGS

In order that the invention may be more fully understand reference will now be made to the accompanying drawings in which.

DETAILED DESCRIPTION OF THE EMBODIMENT

Figure 1:
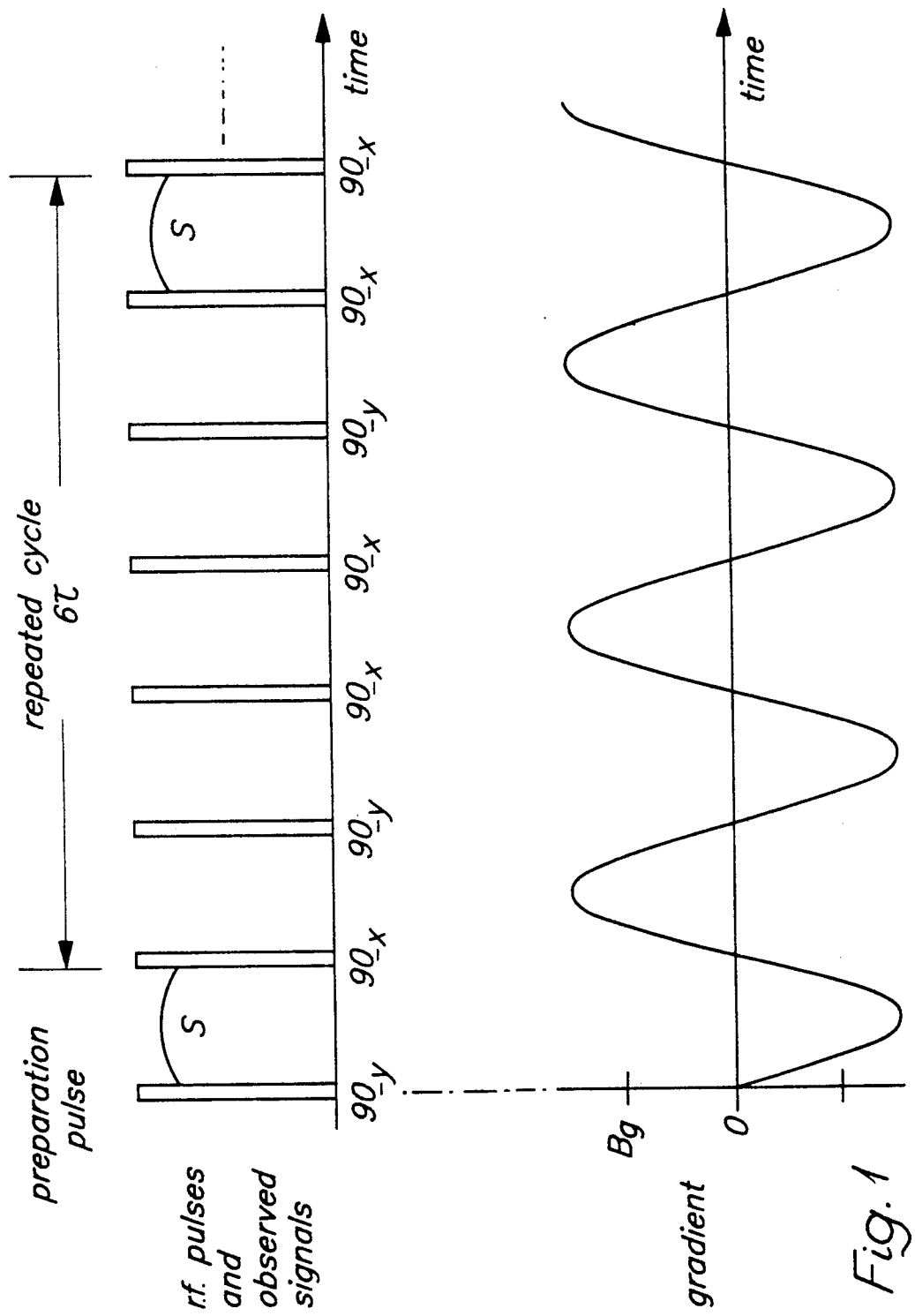
FIG. 1 illustrates diagrammatically a pulse sequence embodying the invention.

Referring now to FIG. 1 there is shown therein a sinusoidal curve which represents an oscillating magnetic gradient field $B_g$ of cycle time period $2\tau$ which is applied to an object in addition to a static magnetic field. This field is applied by standard gradient coils tuned by a series capacitor. In addition there are further windings in the form of a Helmholtz pair to provide a spatially uniform oscillating field.

The object is also subjected to a radio-frequency pulse sequence which is shown in FIG. 1 on the same timescale. The sequence comprises 90° pulses applied at instants when the gradient field $B_g$ has zero value. The pulses of the sequence are applied with equal interpulse spacing and the pulses of the sequence have a time period $\tau$ between successive pulses. The sequence comprises firstly a preparation pulse $90_{-y}$ followed after time interval $\tau$ by a repeated cycle of six pulses of cycle time $6\tau$. The relative rf phase of each pulse is as indicated in FIG. 1 and corresponds to equation (1) above.

There is a time window marked S after the preparation pulse and at the end of each pulse cycle in which sampling of the observed signal takes place.

The samples can be averaged and after Fourier transformation represent the spin density distribution of the excited nuclei, usually protons, in the gradient direction of the magnetic gradient field. Imaging information relating to the object can be built up by repeating the experiment with different orientations of gradient direction of the gradient field relative to the object.

Figure 2:
FIG. 2 illustrates an image of a solid object obtained with the sequence of FIG. 1, and, FIG. 3 is a perspective view of the object imaged in FIG. 2.
Figure 3:
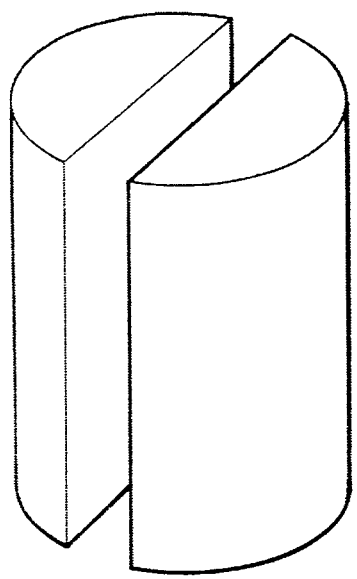

FIG. 2 shows a two dimensional proton density cross sectional image across a rubber bung 7 mm in diameter and 8 mm in length with a 1.5 mm slot cut across a diameter along its length. The actual bung is shown in perspective in FIG. 3. The image was obtained by back projection of 36 profiles each of 71 data points. 256 cycles of the sequence were used for each profile with a pulse gap of 20 μs, the oscillating frequency of the sinusoidal gradient field $B_g$ being 25 kHz. The sample was rotated by 5° between projection measurements. Alternatively in a system with multiple orthogonal gradient coils rotation of the gradient direction can be effected electrically. A suitable arrangement is a pair of magnetic coils positioned in relative quadrature to each other. The direction of the gradient magnetic field is determined by the ratio of the electric currents in the two coils. By changing this ratio the gradient direction can be changed.

In addition a sinusoidal offset field of spatially uniform amplitude was superimposed on the gradient field. This is because radio frequency pulse phase transients and other effects give rise to spurious precession of the magnetisation of order a few hundred Hertz in multipulse work and consequently to a low frequency spike in the Fourier transformed spectrum. To overcome the problem spectra are often recorded a little off resonance so that the low frequency artefacts in the signal do not corrupt the results. The equivalent procedure in this case is to include a sinusoidal offset field so that the oscillating field (including the gradient) is non-zero everywhere over the sample. The low frequency ($\approx$ OHZ) spike then occurs at the side of the profile where it can be suppressed without loss of image information.

As an alternative to the six pulse sequence defined by equation (1) a 12 pulse sequence can be used by taking the six pulse sequence and following it by its Hermitian conjugate to give the following sequence:

$$90_{-y}\text{-}\tau\text{-}(90_{-x}\text{-}\tau\text{-}90_{-y}\text{-}\tau\text{-}90_{-x}\text{-}\tau\text{-}90_{-x}\text{-}\tau\text{-}90_{-y}\text{-} \\ \tau\text{-}90_{-x}\text{-}\tau\text{-}90_{x}\text{-}\tau\text{-}90_{y}\text{-}\tau\text{-}90_{x}\text{-}\tau\text{-}90_{x}\text{-}\tau\text{-}90_{y}\text{-}\tau\text{-}90_{x}\text{-}\tau\text{-})_n \quad (12)$$

In the sequence defined by equation (12) sampling takes place in the sixth and twelfth window of the pulse cycle. An advantage of the 12 pulse sequence is that it is less sensitive to pulse flip angle defects than the six pulse sequence.

In either the six pulse or the 12 pulse sequence it is possible to sample in every third window in order to increase the sampling rate. If this rate of sampling is used then it is necessary to interchange the quadrature magnetisations of each alternate sampling.

We claim:

1. A method of obtaining NMR imaging information from an object, comprising:
   subjecting the object to a static magnetic field, applying a gradient magnetic field which varies sinusoidally in amplitude about a zero value, applying a repetitive sequence of radio frequency pulses only at times of zero value of the said gradient field each having a frequency, magnitude and duration and successive pulses of the sequence being of such relative rf phase, that selected nuclei in the object precess with accumulated phase in each sequence, and measuring the resulting NMR signal from the object.

2. The method as claimed in claim 1 in which the sequence of radio frequency pulses is such that the pulses of the sequence are separated by constant interpulse window lengths equal to half the magnetic gradient field cycle time.

3. The method as claimed in either one of the preceding claims in which a sinusoidal offset magnetic field of spatially uniform amplitude is superimposed on the sinusoidally time-varying gradient magnetic field to shift spikes in the measured signal after Fourier transformation caused by rf phase errors away from areas of interest.

4. The method as claimed in claim 1 or 2 in which an initial radio frequency preparation pulse is applied before the repetitive sequence of radio frequency pulses.

5. The method as claimed in claim 4 in which the preparation pulse and the sequence of pulses each comprise 90° rf pulses, the rf phases of which are in relative phase quadrature with each other and according to the following pattern $$90_{-y}\text{-}(90_{-x}\text{-}-90_{-y}\text{-}-90_{-x}\text{-}-90_{-x}\text{-}-90_{-y}\text{-}-90_{-x}\text{-}-)_n$$

where -y and -x indicate rf relative phase quadrature, t is a predetermined time interval and n is an integer equal to the number of repetitions of the sequence.

6. The method as claimed in claim 1 or 2 in which the measuring of the resultant NMR signal from the object takes place in the time interval between the preparation pulse and the sequence of pulses and between the last two pulses of a repeated sequence.

7. The method as claimed in claim 1 or 2 which is repeated with different directions of gradient magnetic field relative to the sample.

8. The method as claimed in claim 7 in which the direction of a gradient magnetic field is determined by applying two sinusoidally varying electric currents of predetermined ratio to two magnetic coils positioned in relative quadrature to each other.

9. The method as claimed in claim 3 in which an initial radio frequency preparation pulse is applied before the repetitive sequence of radio frequency pulses.

10. The method as claimed in claim 3 in which an initial radio frequency preparation pulse is applied before the repetitive sequence of radio frequency pulses and the preparation pulse and the sequence of pulses each comprise 90° rf pulses, the rf phases of which are in relative phrase quadrature with each other and according to the following pattern $$90_{-y}\text{-}(90_{-x}\text{-}-90_{-y}\text{-}-90_{-x}\text{-}-90_{-x}\text{-}90_{-y}\text{-}-90_{-x}\text{-}-)_n$$

where -y and -x indicate rf relative phase quadrature, t is a predetermined time interval and n is an integer equal to the number of repetitions of the sequence.

11. The method as claim in claim 3 in which the measuring of the resultant NMR signal from the object takes place in the time interval between the preparation pulse and the sequence of pulses and between the last two pulses of a repeated sequence.

12. The method as claimed in claim 3 which is repeated with different directions of gradient magnetic field relative to the sample.

13. The method as claimed in claim 3 which is repeated with different directions of gradient magnetic field relative to the sample and in which the direction of a gradient magnetic field is determined by applying two sinusoidally varying electric currents of predetermined ratio to two magnetic coils positioned in relative quadrature to each other.

* * * * *